United States Patent
Blake et al.

(10) Patent No.: US 9,146,259 B2
(45) Date of Patent: Sep. 29, 2015

(54) SMART CURRENT TRANSFORMERS

(75) Inventors: Arthur J. Blake, Leominster, MA (US); Vishwas M. Deokar, Acton, MA (US); Namwook Paik, Acton, MA (US); James S. Spitaels, Shrewsbury, MA (US)

(73) Assignee: SCHNEIDER ELECTRIC IT CORPORATION, West Kingston, RI (US)

( * ) Notice: Subject to any disclaimer, the term of this patent is extended or adjusted under 35 U.S.C. 154(b) by 354 days.

(21) Appl. No.: 13/089,787

(22) Filed: Apr. 19, 2011

(65) Prior Publication Data

US 2012/0268106 A1   Oct. 25, 2012

(51) Int. Cl.
*G01R 15/18* (2006.01)
*G01R 1/22* (2006.01)
*H01F 38/30* (2006.01)

(52) U.S. Cl.
CPC .............. *G01R 15/186* (2013.01); *G01R 1/22* (2013.01); *H01F 38/30* (2013.01)

(58) Field of Classification Search
CPC .... G01R 1/203; G01R 15/181; G01R 15/183; G01R 15/185; G01R 15/186; G01R 1/22; G01R 15/207; H01F 38/38; H01F 38/28–38/30
USPC ............................ 324/127, 129, 149; 439/409
See application file for complete search history.

(56) References Cited

U.S. PATENT DOCUMENTS

| | | | |
|---|---|---|---|
| 4,158,808 A | | 6/1979 | Massa et al. |
| 4,258,348 A | * | 3/1981 | Belfer et al. ............. 336/73 |
| 5,179,376 A | | 1/1993 | Pomatto |
| 5,800,187 A | | 9/1998 | Vermon et al. |
| 5,831,428 A | | 11/1998 | Pyle et al. |
| 5,855,491 A | * | 1/1999 | Hintner et al. ............. 439/409 |
| 5,896,027 A | | 4/1999 | So et al. |
| 5,959,818 A | | 9/1999 | Blakely |
| 5,995,911 A | | 11/1999 | Hart |
| 6,064,192 A | * | 5/2000 | Redmyer ............. 324/127 |
| 6,091,237 A | | 7/2000 | Chen |

(Continued)

FOREIGN PATENT DOCUMENTS

| CN | 1717844 A | 1/2006 |
|---|---|---|
| CN | 201035075 Y | 3/2008 |

(Continued)

OTHER PUBLICATIONS

Power Systems Design, Smart Grid Integrity, 2010, http://www.powersystemsdesign.com/smart-grid-integrity.*

(Continued)

*Primary Examiner* — Patrick Assouad
*Assistant Examiner* — Demetrius Pretlow
(74) *Attorney, Agent, or Firm* — Lando & Anastasi LLP

(57) ABSTRACT

According to one aspect, embodiments of the invention provide a current monitoring device comprising a current transformer configured to be removeably coupled to a power line and to generate a reference signal having a level related to a current level of the power line, a sensor circuit connected to the current transformer and configured to be removeably coupled to a communications bus and to convert the reference signal to a digital reference signal and provide a signal indicative of the current level to the communication bus, and a housing containing the sensor circuit and the current transformer.

14 Claims, 6 Drawing Sheets

(56) References Cited

U.S. PATENT DOCUMENTS

| | | | |
|---|---|---|---|
| 6,243,626 B1 | 6/2001 | Schanin | |
| 6,291,986 B1* | 9/2001 | Sorensen | 324/156 |
| 6,292,717 B1 | 9/2001 | Alexander et al. | |
| 6,313,641 B1 | 11/2001 | Brooks | |
| 6,330,516 B1 | 12/2001 | Kammeter | |
| 6,373,238 B2* | 4/2002 | Lewis et al. | 324/107 |
| 6,452,767 B1 | 9/2002 | Brooks | |
| 6,634,240 B1 | 10/2003 | Wallen | |
| 6,788,508 B2 | 9/2004 | Papallo, Jr. et al. | |
| 6,865,073 B2 | 3/2005 | Werner et al. | |
| 7,253,640 B2 | 8/2007 | Engel et al. | |
| 7,265,533 B2 | 9/2007 | Lightbody et al. | |
| 7,412,338 B2 | 8/2008 | Wynans et al. | |
| 7,453,267 B2 | 11/2008 | Westbrock, Jr. et al. | |
| 8,004,226 B2 | 8/2011 | Hartman et al. | |
| 8,321,163 B2 | 11/2012 | Ewing et al. | |
| 2003/0222603 A1 | 12/2003 | Mogilner et al. | |
| 2004/0075343 A1 | 4/2004 | Wareham et al. | |
| 2004/0136124 A1 | 7/2004 | Engel et al. | |
| 2004/0183522 A1 | 9/2004 | Gunn et al. | |
| 2005/0210337 A1 | 9/2005 | Chester et al. | |
| 2006/0238932 A1* | 10/2006 | Westbrock et al. | 361/42 |
| 2007/0136010 A1* | 6/2007 | Gunn et al. | 702/62 |
| 2008/0007416 A1 | 1/2008 | Cern | |
| 2008/0094162 A1* | 4/2008 | Schaerrer et al. | 336/178 |
| 2008/0126665 A1 | 5/2008 | Burr et al. | |
| 2008/0180275 A1* | 7/2008 | Whitaker et al. | 340/870.03 |
| 2008/0238573 A1 | 10/2008 | Yamazaki | |
| 2009/0066317 A1* | 3/2009 | de Buda | 324/103 R |
| 2009/0115403 A1* | 5/2009 | Bernklau | 324/127 |
| 2009/0292403 A1 | 11/2009 | Howell et al. | |
| 2010/0060469 A1 | 3/2010 | Hetzmannseder et al. | |
| 2010/0085036 A1 | 4/2010 | Banting et al. | |
| 2010/0235122 A1 | 9/2010 | McCrea et al. | |
| 2010/0237853 A1 | 9/2010 | Bose et al. | |
| 2010/0264906 A1 | 10/2010 | Shamir et al. | |
| 2010/0299401 A1 | 11/2010 | Lloyd | |
| 2010/0308792 A1 | 12/2010 | Rupert et al. | |
| 2010/0328849 A1 | 12/2010 | Ewing et al. | |
| 2011/0046792 A1 | 2/2011 | Imes et al. | |
| 2011/0148393 A1 | 6/2011 | de Buda | |
| 2012/0062249 A1 | 3/2012 | Shamir | |
| 2012/0085627 A1 | 4/2012 | Yang | |
| 2012/0200285 A1 | 8/2012 | Carpenter et al. | |
| 2012/0271570 A1 | 10/2012 | Paik et al. | |
| 2013/0018609 A1 | 1/2013 | Filippenko et al. | |
| 2013/0090869 A1 | 4/2013 | Ewing et al. | |

FOREIGN PATENT DOCUMENTS

| | | |
|---|---|---|
| CN | 101277130 A | 10/2008 |
| CN | 201667273 U | 12/2010 |
| EP | 1102073 A1 | 5/2001 |
| EP | 1 703 289 A1 | 9/2006 |
| EP | 2 354 799 A1 | 8/2011 |
| GB | 2 241 396 A | 8/1991 |
| WO | 2011/150173 A1 | 12/2011 |

OTHER PUBLICATIONS

International Search Report for PCT/US2011/038087 dated Nov. 10, 2011.
"Panelboard Monitoring System", www.veris.com, 2008 Veris Industries, pp. 136-137.
"TED 5000 FOOTPRINTS User Manual", www.theenergydetective.com, pp. 1-37.
"Emonitor User Manual", 2010 PowerHouse Dynamics, Inc., pp. 1-50.
"Emonitor Installation Guide", 2010 PowerHouse Dynamics, Inc., pp. 1-39.
International Search Report for PCT/US2012/033908 dated Jul. 27, 2012.
International Search Report for PCT/US2011/038087 mailed Nov. 10, 2011.
Chung-Ping Young et al., "Digital Power Metering Manifold", IEEE Transactions on Instumentation and Measurement, IEEE Service Center, Piscataway, NJ, US, vol. 47, No. 1, Feb. 1, 1998, XP011024460, pp. 224-228.
International Search Report for PCT/US2012/033903 dated Aug. 8, 2012.
Notification of Transmittal of the International Search Report and the Written Opinion of the International Searching Authority from corresponding PCT/US2012/033905 mailed Jul. 3, 2013.

* cited by examiner

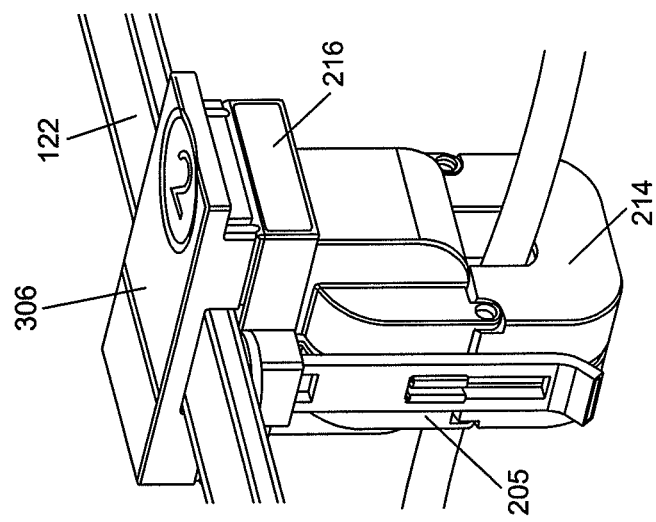
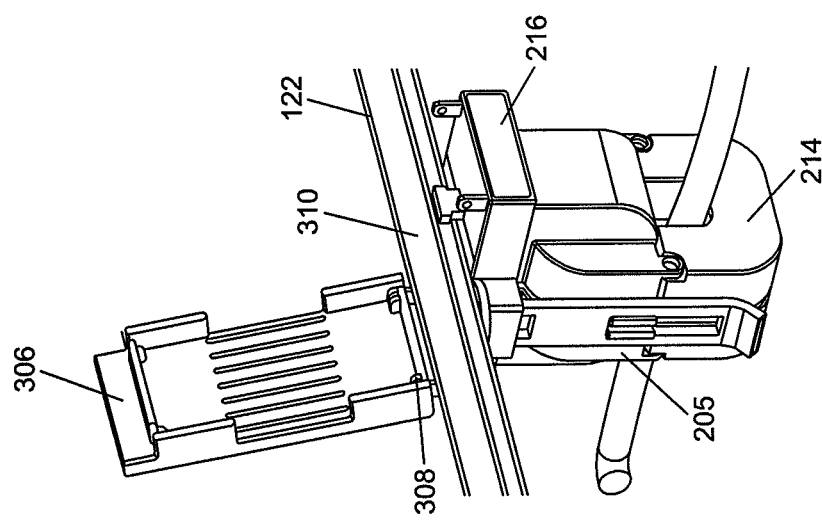
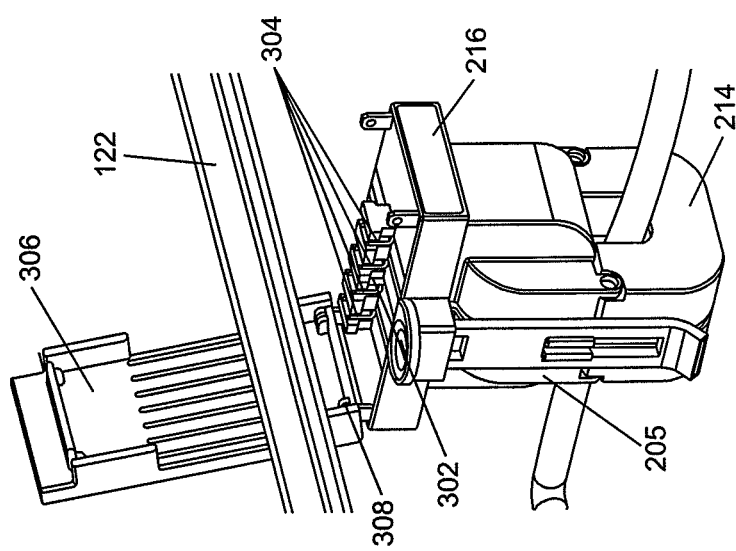

SMART CURRENT TRANSFORMERS

BACKGROUND OF INVENTION

1. Field of the Invention

At least one example in accordance with the present invention relates generally to systems and methods for monitoring a load center for current, power and energy usage.

2. Discussion of Related Art

A load center or panelboard is a component of an electrical supply system which divides an electrical power feed from a power line into different subsidiary circuit branches. Each subsidiary circuit branch may be connected to a different load. Thus, by dividing the electrical power feed into subsidiary circuit branches, the load center may allow a user to individually control and monitor the current, power and energy usage of each load.

Current sensors are commonly used to monitor activity of a load center. For example, Current Transformers (CT) are commonly used to monitor current, power and/or energy consumption in a subsidiary or main branch of a load center. A CT may be used to measure current in a branch by producing a reduced current signal, proportionate to the current in the branch, which may be further manipulated and measured. For example, a CT coupled to a branch of a load center may produce a reduced current AC signal, proportionate to the magnitude of AC current in the branch. The reduced current AC signal may then either be measured directly or converted to a DC signal and then measured. Based on the signal received, the level of current in the subsidiary branch may be determined

SUMMARY OF THE INVENTION

Aspects in accord with the present invention are directed to a system and method for monitoring a load center.

In one aspect the present invention features a current monitoring device comprising a current transformer configured to be removeably coupled to a power line and to generate a reference signal having a level related to a current level of the power line, a sensor circuit connected to the current transformer and configured to be removeably coupled to a communications bus and to convert the reference signal to a digital reference signal and provide a signal indicative of the current level to the communication bus, and a housing containing the sensor circuit and the current transformer. In one embodiment, the sensor circuit is configured to receive power from the communications bus.

According to one embodiment, the housing includes a first portion containing the current transformer and a second portion containing the sensor circuit, and wherein the first portion is rotatably coupled to the second portion. In one embodiment, the second portion of the housing includes an insulation displacement connector configured to couple the sensor circuit to the communication bus. In another embodiment, the second portion of the housing further includes a lid configured to lock the communication bus in place adjacent to the insulation displacement connector.

According to one embodiment, the housing is configured to be rotated between a first position and a second position, wherein, in the first position, the first portion of the housing is rotated away from the second portion to allow external access to an interior chamber, and wherein, in the second position, the first portion of the housing is rotated towards the second portion so that the housing encompasses the interior chamber.

According to another embodiment, the sensor circuit further includes a transceiver coupled to a microcontroller and configured to receive the digital reference signal and provide data related to the digital reference signal to the communications bus. In one embodiment, the transceiver is further configured to receive data from the communication bus indicative of at least one of voltage, frequency and phase information of the power line. In another embodiment, the microcontroller is configured to calculate power parameters of the power line using the digital reference signal and the data from the communications bus.

In another aspect the present invention features a method for monitoring a power line within a load center, the method comprising coupling a current transformer to the power line within the load center, coupling a sensor circuit to a communication bus within the load center, generating, with the current transformer, a reference signal having a level related to a current level of the power line, converting, with the sensor circuit, the reference signal to a digital reference signal, and providing the digital reference signal to the communication bus.

According to one embodiment, the act of coupling a current transformer to the power line includes encompassing the power line within the current transformer. In another embodiment, the act of coupling a sensor circuit to a communication bus includes piercing an outer insulation layer of the communication bus with at least one contact of the sensor circuit and connecting the at least one contact to an appropriate conductor within the communication bus.

According to another embodiment, the method further comprises assigning a unique address to the sensor circuit over the communications bus. In one embodiment, the act of providing includes providing the digital reference signals to the communication bus at a time designated by an external controller. In another embodiment, the method further comprises receiving, with the sensor circuit, power from the communications bus.

In one aspect the present invention features a device for monitoring current in a power line, the device comprising a current transformer configured to generate a reference signal having a level related to a current level of the power line, a sensor circuit configured to convert the reference signal to a digital reference signal and provide data related to the digital reference signal to a communication bus, and means for containing the current transformer and the sensor circuit within a single housing and coupling the single housing to the power line and the communications bus.

According to one embodiment, the sensor circuit is configured to receive power from the communications bus. In another embodiment, the sensor circuit includes a transceiver coupled to a microcontroller and configured to receive the digital reference signal and provide data related to the digital reference signal to the communications bus.

According to another embodiment, the transceiver is further configured to receive data from the communication bus indicative of at least one of voltage, frequency and phase information of the power line. In one embodiment, the microcontroller is configured to calculate power parameters of the power line using the digital reference signal and the data from the communications bus.

In one aspect the present invention features a system for monitoring a plurality of circuit branches coupled to an input line, the system comprising a communication bus, a plurality of sensor circuits, each configured to be coupled to the communication bus and at least one of the plurality of circuit branches, wherein each sensor circuit is further configured to sample current in the at least one of the plurality of circuit branches, a controller configured to be coupled to the communication bus and the input line, wherein the controller is further configured to sample voltage on the input line, and wherein the controller is further configured to synchronize, via the communication bus, current sampling performed by the plurality of sensor circuits with the voltage sampling performed by the controller.

According to one embodiment, the controller is further configured to receive, via the communication bus, current sampling data from at least one of the plurality of sensor circuits. In another embodiment, the controller is further configured to calculate at least one of RMS current, power, or energy usage of at least one of the plurality of circuit branches based on the current sampling data received from the at least one of the plurality of sensor circuits and voltage sampling data. In one embodiment, the controller is further configured to determine a phase angle of a voltage waveform at which current sampling and voltage sampling should occur.

According to another embodiment, at least one of the plurality of sensor circuits includes a current transformer coupled to the at least one of the plurality of circuit branches.

In another aspect the present invention features a method for monitoring a plurality of circuit branches coupled to a power line, the method comprising coupling a sensor circuit to each one of the plurality of circuit branches and to a communication bus, coupling a controller to the communication bus and to the power line, sampling, with at least one of the sensor circuits, current in at least one of the plurality of circuit branches, sampling, with the controller, voltage on the power line, and synchronizing, with the controller via the communication bus, the sampling of current by the at least one of the sensor circuits and the sampling of voltage by the controller.

According to one embodiment, the act of synchronizing comprises detecting, by the controller, a voltage waveform on the power line, and determining, with the controller, a phase angle of the voltage waveform at which the acts of sampling current and sampling voltage should occur. In one embodiment, the act of synchronizing further comprises broadcasting, with the controller via the communication bus, to each one of the sensor circuits that the act of sampling current should begin, and initiating, after a predetermined delay following the act of broadcasting, the act of sampling voltage. In another embodiment, the act of synchronizing further comprises broadcasting, with the controller via the communication bus, to at least one of the sensor circuits that the act of sampling current should begin, and initiating, after a predetermined delay following the act of broadcasting, the act of sampling voltage.

According to another embodiment, the method further comprises receiving, with the controller via the communication bus, current sampling data from at least one of the sensor circuits. In one embodiment, the method further comprises transmitting the current sampling data to an external client. In another embodiment, the method further comprises calculating, with the controller, at least one of RMS current, voltage or energy usage of at least one of the plurality of circuit branches based on the current sampling data received from the at least one of the sensor circuits and voltage sampling data.

According to one embodiment, the method further comprises transmitting the at least one of RMS current, voltage or energy usage to an external client. In one embodiment, the act of transmitting includes transmitting the at least one of RMS current, voltage or energy usage wirelessly to an external client. In another embodiment, the method further comprises assigning, with the controller via the communication bus, unique addresses to each one of the sensor circuits.

According to another embodiment, the method further comprises confirming, with the controller in response to the act of receiving current sampling data, that the current sampling data was received successfully, and entering, with the at least one of the sensor circuits, in response to the act of confirming, power save mode. In one embodiment, the act of entering power save mode comprises initiating a sleep timer, wherein the at least one of the sensor circuits remains in power save mode until expiration of the sleep timer.

In one aspect the present invention features a system for monitoring a plurality of circuit branches coupled to an input line, the system comprising a communication bus, a plurality of sensor circuits, each configured to be coupled to the communication bus and at least one of the plurality of circuit branches, wherein each sensor circuit is further configured to sample current in the at least one of the plurality of circuit branches, a controller configured to be coupled to the communication bus and the input line, means for synchronizing current sampling performed by at least one of the plurality of sensor circuits and voltage sampling performed by the controller.

According to one embodiment, the controller is further configured to receive, via the communication bus, current sampling data from the at least one of the plurality of sensor circuit. In one embodiment, the controller is further configured to calculate at least one of RMS current, power, or energy usage of at least one of the plurality of circuit branches based on the current sampling data received from the at least one of the plurality of sensor circuit and voltage sampling data.

In another aspect the present invention features a system for monitoring a plurality of circuit branches coupled to an input line within a load center, the system comprising a plurality of current sensors, each configured to be coupled to at least one of the plurality of circuit branches and to produce a signal having a level related to a current level of the one of the plurality of circuit branches, a communications bus, a plurality of sensor circuits, each coupled to an associated one of the plurality of current sensors and configured to be coupled to the communication bus, wherein each one of the plurality of sensor circuits is configured to convert the signal from the associated one of the plurality of current sensors to a digital measurement signal and provide the digital measurement signal to the communication bus, and a controller configured to be coupled to the communication bus and configured to receive the digital measurement signal from each sensor circuit over the communication bus and transmit data related to the digital measurement signal from each sensor circuit to an external client.

According to one embodiment, the controller is further configured to be located within the load center. In another embodiment, the system further comprises a wireless radio coupled to the controller, wherein the wireless radio is configured to transmit the data related to the digital measurement signal from each sensor circuit to an external client.

According to another embodiment, each one of the plurality of sensor circuits is configured to be removeably coupled to the communication bus. In one embodiment, each one of the plurality of current sensors is configured to be removeably coupled to one of the plurality of circuit branches. In another embodiment, each one of the plurality of sensor circuits includes a secondary microcontroller coupled to the associated one of the plurality of current sensors and configured to convert the analog reference signal from the associated one of the plurality of current sensors to a digital measurement signal and provide the digital measurement signal to the communication bus.

According to one embodiment, the controller includes a primary microcontroller configured to receive the digital measurement signal from each of the plurality of sensor circuits and provide the data related to the digital measurement signal from each of the plurality of sensor circuits to the external client. In one embodiment, the controller further includes a power module coupled to at least one of the plurality of circuit branches, wherein the primary microcontroller is further configured to measure at least one of voltage, phase and frequency of the at least one of the plurality of circuit branches and transmit data related to the at least one of the voltage, the phase and the frequency to at least one of the plurality of sensor circuits via the communication bus.

According to another embodiment, the primary microcontroller is configured to assign a unique address to each one of the plurality of sensor circuits and to control communication on the communication bus. In one embodiment, the primary microcontroller is further configured to calculate power and energy parameters of the at least one of the plurality of circuit branches based on the digital measurement signal from at least one sensor circuit and the measured at least one of voltage, phase and frequency of the at least one of the plurality of circuit branches According to one embodiment, at least one secondary microcontroller is configured to receive the data related to the at least one of the voltage, the phase and the frequency from the primary microcontroller and calculate power and energy parameters of one of the plurality of circuit branches based on the digital measurement signal and the received data related to the at least one of the voltage, the phase and the frequency.

In one aspect the present invention features a method for monitoring a plurality of circuit branches coupled to a power line within a load center, the method comprising coupling a current transformer to each one of the plurality of circuit branches, coupling a plurality of sensor circuits to a communication bus, wherein each of the sensor circuits is coupled to one of the current transformers, coupling a concentrator to the communication bus, generating, in each current transformer, a reference signal having a level related to a current level of one of the plurality of circuit branches, converting, with each of the plurality of sensor circuits, a reference signal from a corresponding current transformer to a digital measurement signal and providing the digital measurement signal to the communication bus, receiving, with the concentrator, the digital measurement signal from each sensor circuit over the communication bus, and transmitting data related to the digital measurement signal from each sensor circuit to an external client.

According to one embodiment, the method further comprises managing communication over the communication bus with the concentrator. In one embodiment, the act of managing includes assigning, with the concentrator, a unique address to each one of the plurality of sensor circuits. In another embodiment, the act of transmitting includes transmitting the data related to the digital measurement signal from each sensor circuit wirelessly to an external client.

According to another embodiment, the method further comprises measuring, with the concentrator, at least one of voltage, phase and frequency of power provided to the plurality of circuit branches, and transmitting data related to the at least one of the voltage, the phase and the frequency to the plurality of sensor circuits via the communication bus.

According to one embodiment, the method further comprises calculating, with the plurality of sensor circuits, power and energy parameters of the plurality of circuit branches based on the received data related to the at least one of the voltage, the phase and the frequency, providing data related to the power and energy parameters to the concentrator via the communication bus, and transmitting the data related to the power and energy parameters to the external client.

In another aspect the present invention features a system for monitoring a plurality of circuit branches coupled to an input line within a load center, the system comprising a plurality of current transformers, each configured to be coupled to one of the plurality of circuit branches and to produce a signal having a level related to a current level of the one of the plurality of circuit branches, a plurality of sensor circuits, each coupled to an associated one of the plurality of current transformers, and configured to convert the signal from the associated one of the plurality of current transformers to a digital measurement signal, a concentrator configured to receive the digital measurement signals and transmit data related to the digital measurement signals to an external client, and means for providing the digital measurement signals from the plurality of sensor circuits to the concentrator over a bus.

According to one embodiment, the concentrator is further configured to be located within the load center. According to another embodiment, the system further comprises a wireless radio coupled to the concentrator, wherein the wireless radio is configured to transmit the data related to the digital measurement signals to an external client.

BRIEF DESCRIPTION OF DRAWINGS

The accompanying drawings are not intended to be drawn to scale. In the drawings, each identical or nearly identical component that is illustrated in various FIGs. is represented by a like numeral. For purposes of clarity, not every component may be labeled in every drawing. In the drawings:

FIG. 3A is a schematic diagram of a smart CT prior to being coupled to a communication bus in accordance with aspects of the present invention;

FIG. 3B is a schematic diagram of a smart CT after being coupled to a communication bus in accordance with aspects of the present invention;

FIG. 3C is a schematic diagram of a smart CT locked together with a communication bus in accordance with aspects of the present invention;

DETAILED DESCRIPTION

Figure 1:
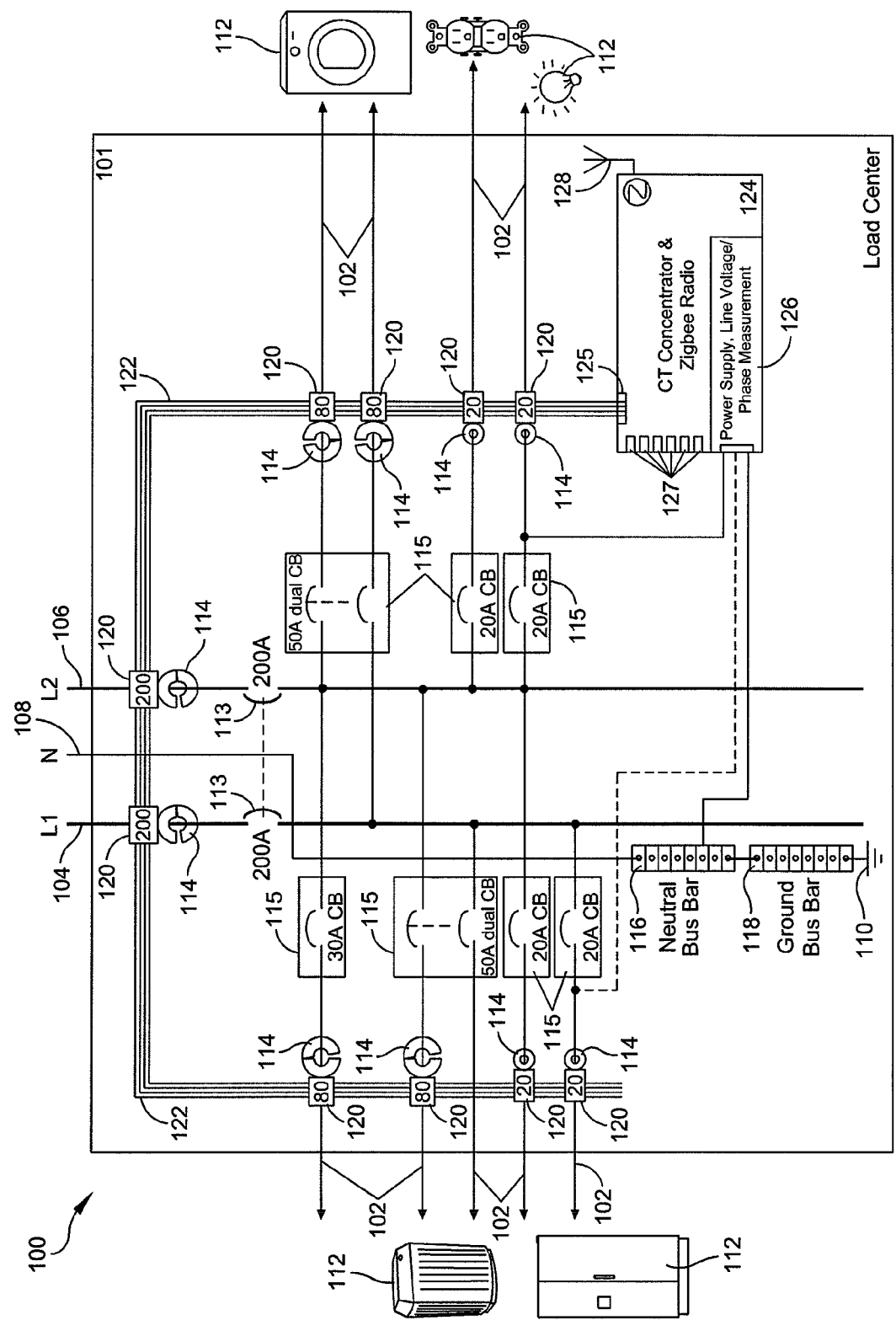
FIG. 1 is a circuit diagram of a load center in accordance with aspects of the present invention.

Embodiments of the invention are not limited to the details of construction and the arrangement of components set forth in the following description or illustrated in the drawings. Embodiments of the invention are capable of being practiced or of being carried out in various ways. Also, the phraseology and terminology used herein is for the purpose of description and should not be regarded as limiting. The use of "including," "comprising," or "having," "containing", "involving", and variations thereof herein, is meant to encompass the items listed thereafter and equivalents thereof as well as additional items.

As discussed above, CT's may be utilized with a load center of an electrical supply system to monitor circuit branches and assist in providing efficient energy management. For instance, CT's may be coupled to circuit branches inside or outside of a load center. However, multiple challenges with CT's may arise as the electrical supply system grows in size and complexity.

Existing methods and systems typically rely on a system of individual CT's, each connected to a main controller and measurement unit in a "hub and spoke" topology. In such a system, each CT requires dedicated cabling connecting it to the main controller and its measurement unit, so that the number of cables or wires increases linearly with the number of sensors. In addition, some jurisdictions have regulatory requirements on the amount of "gutter space" (i.e., space within the panelboard free of wiring and other electronic devices) available within a panelboard. Therefore, as the number of CT's increases, the amount of cabling and circuitry within a panelboard may become difficult to manage and violate regulatory requirements.

In some instances it may even be difficult to physically place all of the desired CT's and corresponding circuitry within the load center, and due to the complexity of such a load center; installation, expansion and maintenance may also be expensive, difficult and even hazardous.

At least some embodiments described herein overcome these problems and provide a relatively small, less complex and more manageable method and system for utilizing CT's to monitor circuit branches of a load center.

FIG. 1 shows a load center 100 that includes a system for monitoring subsidiary circuit branches 102 of the load center 100 according to one embodiment of the current invention. The load center 100 includes a housing 101. Within the housing 101, the load center 100 includes a first input power line 104, a second input power line 106, a plurality of circuit branches 102, a neutral line 108, and a ground connection 110. The first and second input power lines 104, 106 are each configured to be coupled to an external power source (e.g., a utility power system) (not shown). Each one of the plurality of circuit branches 102 is configured to be coupled between one of the input power lines 104, 106 and an external load 112 (e.g., an appliance, a power outlet, a light etc.). According to one embodiment, each one of the input power lines 104, 106 includes a circuit breaker 113 coupled between the input power line 104, 106 and circuit branches 102. According to another embodiment, each one of the plurality of circuit branches 102 includes a circuit breaker 115 coupled between the input power line 104, 106 and an external load 112. In one embodiment, the current rating of each of the circuit breakers 113, 115 may be configured based on the power required by the external load 112 to which the circuit breakers 113, 115 associated circuit branch 102 is coupled. The neutral line 108 is coupled to the ground connection 110. According to one embodiment, the neutral line is coupled to the ground connection 110 via a neutral bus bar 116. According to another embodiment, the ground connection 110 is coupled to the neutral line 108 via a ground bus bar 118.

Within the housing 101, the load center 100 also includes a plurality of Current Transformers (CT) 114, a plurality of smart sensor circuits 120, a communication bus 122, and a CT concentrator 124. According to one embodiment, the communication bus 122 includes a plurality of wires. For example, in one embodiment, the communication bus 122 is a ribbon cable including 4 wires (a power line, a return line, D+ differential pair line, D− differential pair line); however, in other embodiments, the communication bus 122 may include any number and type of wires. Each one of the plurality of CT's 114 is coupled to at least one of the plurality of circuit branches 102. According to one embodiment, CT's 114 may also be coupled to each input line 104, 106. According to one embodiment, each CT 114 encompasses a corresponding circuit branch 102 or input line 104, 106. Each one of the plurality of CT's is also coupled to a corresponding smart sensor circuit 120. Each smart sensor circuit 120 is coupled to the communication bus 122.

According to one embodiment, each smart sensor circuit 120 is connected to the communication bus 122 so that each smart sensor circuit 120 is in electrical communication with the CT concentrator 124. In one embodiment, each smart sensor circuit 120 is clamped onto the communication bus 122. For example, in one embodiment, electrical contacts (not shown) of a smart sensor circuit 120 are pressed onto the communication bus 122 so that the electrical contacts pierce an insulation layer of the communication bus 122 and become electrically coupled to appropriate conductors within the communication bus 122. In other embodiments, the smart sensor circuits 120 may be coupled differently to the communication bus 122. For example, according to one embodiment, the smart sensor circuits 120 may be coupled to the communication bus 122 via a bus bar or daisy chained connectors (not shown). The connection of smart sensor circuits 120 to the communication bus 122 is discussed in greater detail below.

According to one embodiment, the CT concentrator 124 includes a digital interface 125, at least one analog interface 127, a power module 126 and a Zigbee RF interface 128. The communication bus 122 is coupled to the digital interface 125. The power module 126 is coupled to at least one input power line 104, 106 via at least one branch circuit 102. According to one embodiment (not shown), at least one CT 114 is coupled directly to at least one analog interface 127.

According to one embodiment, AC power is provided from an external source (e.g., a utility power system) to the input lines 104, 106. AC power from the input lines 104, 106 is provided to each of the external loads 112, via the circuit branches 102. The circuit breakers 113 are configured to automatically open and prevent current in an input line 104, 106 if an overload or short circuit is detected in the input line 104, 106. The circuit breakers 115 are configured to automatically open and prevent current in a circuit branch 102 if an overload or short circuit is detected in the circuit branch 102.

The power module 126 of the CT concentrator 124 receives AC power from at least one input line 104, 106. Using the AC power, the power module 126 powers the CT concentrator 124. In addition, the CT concentrator 124 measures the AC voltage, frequency and/or phase of the AC power. According to one embodiment, the CT concentrator 124 is configured to communicate the measured AC voltage, frequency and/or phase information to the smart sensor circuits 120, via the communication bus 122. For example, in one embodiment, the CT concentrator 124 transmits phase information of the AC power to the smart sensor circuits 120 so that the CT concentrator 124 may be synchronized with the smart sensor circuits 120. The synchronization of the CT concentrator 124 with the smart sensor circuits 120 will be discussed in greater detail below. According to one embodiment, the CT concentrator is also capable of being powered by a battery.

AC current passing through a circuit branch 102 or input line 104, 106 induces a proportionate AC current in its associated CT 114 which encompasses the circuit branch 102 or input line 104, 106. According to one embodiment, where a CT 114 may be coupled to multiple circuit branches 102, an AC current proportionate to the combined current in the multiple circuit branches is induced in the CT 114 which encompasses the multiple circuit branches.

The smart sensor circuit 120 coupled to the CT 114 converts the proportionate AC current from the CT 114 into a digital value and then transmits the digital value, over the communications bus 122 to the CT concentrator 124. In addition, the smart sensor circuit 120 may be configured to utilize the voltage, frequency and/or phase information received from the CT concentrator 124 over the communications bus 122. For example, in one embodiment, the smart sensor circuit 120 utilizes the phase information received from the CT concentrator 124 to synchronize operation with the CT concentrator 124 such that current measurements performed by the smart sensor circuits 120 can by synchronized with voltage measurements made by the CT concentrator 124. In another example, the smart sensor circuit 120 utilizes the voltage, frequency and/or phase information to calculate power and energy parameters such as RMS current, true and apparent power, and power factor of the circuit branch 102 or input line 104, 106. This information is also converted into digital values and sent to the digital interface 125 of the CT concentrator 124 over the communications bus 122. According to one embodiment, at least one CT 114 may also provide analog signals, proportionate to the AC current passing through the circuit branch 102, directly to an analog interface 127 of the CT concentrator 124.

According to one embodiment, upon receiving the current information from the smart sensor circuits 120, the CT concentrator 124 utilizes the measured voltage, frequency and/or phase information to calculate power and energy parameters such as RMS current, true and apparent power, and power factor of the circuit branch 102 or input line 104, 106.

According to one embodiment, upon receiving the current information and receiving and/or calculating the power information, the CT concentrator 124 transmits the current, power and energy information to an external client (e.g., a web server, in-home display, internet gateway etc.) via the wireless Zigbee RF interface 128 to assist in power management of the load center 100 and to assist in power management and control of a residence or other facility containing the system. The CT concentrator 124 may also transmit the current, power and energy information to an external client via a wired connection or a different type of wireless connection.

By including a single communication bus 122 to which all smart sensor circuits 120 are coupled, a relatively small, less complex and more manageable method and system for utilizing a plurality of CT's 114 to monitor circuit branches 102 of a load center 100 is provided.

Figure 2B:
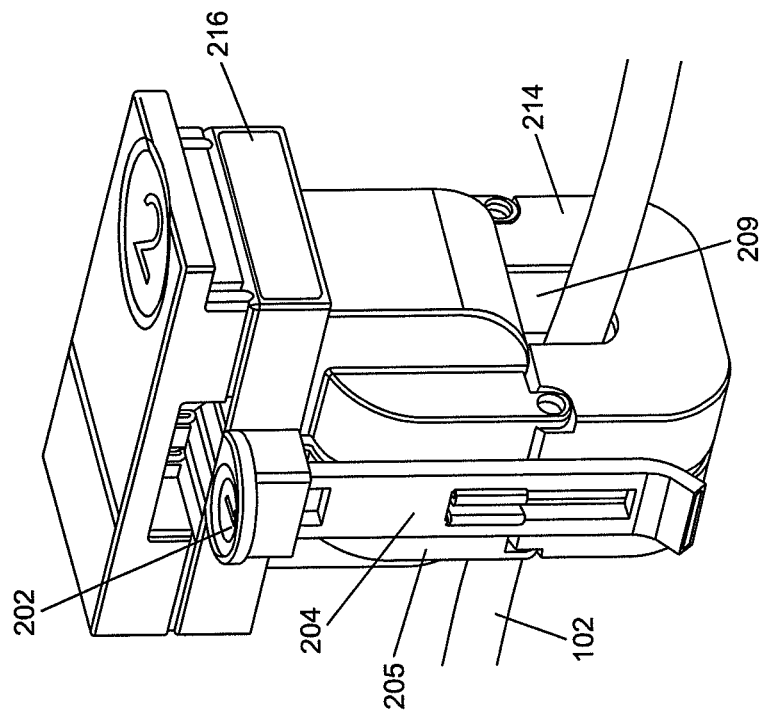
FIG. 2B is a schematic diagram of a smart CT after being coupled to a circuit branch in accordance with aspects of the present invention.
Figure 2A:
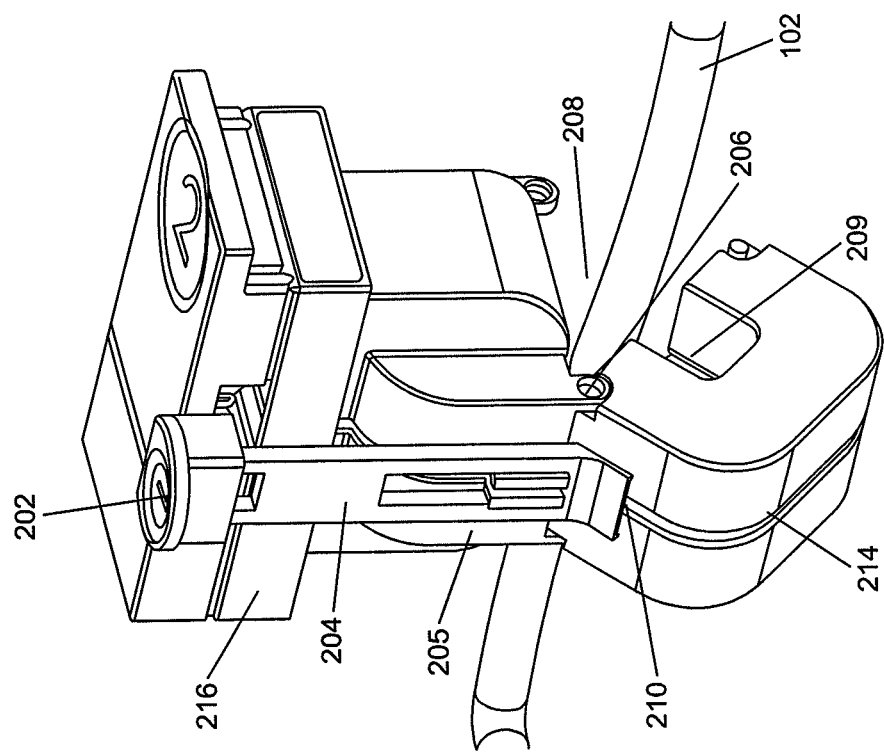
FIG. 2A is a schematic diagram of a smart CT prior to being coupled to a circuit branch in accordance with aspects of the present invention.

FIGS. 2A and 2B illustrate one embodiment of the process of coupling a CT 114 to a circuit branch 102. According to one embodiment, a housing 205 includes a CT 114 and a smart sensor circuit 120 enclosed therein. In one embodiment, a first portion 214 of the housing 205 includes a CT 114 and a second portion 216 includes a smart sensor circuit 120. FIG. 2A illustrates the first portion 214 prior to being coupled to a circuit branch 102 and FIG. 2B illustrates the first portion 214 after being coupled to a circuit branch 102.

The first portion 214 is coupled to the second portion 216 via a hinge 206. The second portion 216 includes a button 202 coupled to a lever 204. Prior to the first portion 214 being coupled to the circuit branch 102, the lever 114 is in an upward position, allowing the first portion 214 to swing away from the second portion 216 and create an opening 208 by which a circuit branch 102 may be inserted. When connection to a circuit branch 102 is desired, a user may configure the first portion 214 so that the circuit branch 102 is inserted through the opening 208 into an interior chamber 209. The user may then press down on the button 202, causing the lever 204 to move in a downwards direction. The lever 204 presses against an outside portion 210 of the first portion 214, causing the first portion 214 to swing towards the second portion 216 and capture the circuit branch 102 within the interior chamber 209 of the first portion 214. According to other embodiments, the first portion 214 may be connected to the circuit branch 102 differently. For example, the first portion 214 may be manually placed around the circuit branch 102. As discussed above, after the circuit branch 102 is encompassed by the first portion 214 (and hence also the CT 114), an AC current in the circuit branch 102 will produce a proportionate AC current within the CT 114.

FIGS. 3A, 3B and 3C illustrate the process of coupling the second portion 216 to a communications bus 122. FIG. 3A illustrates the second portion 216 prior to being connected to a communications bus 122. FIG. 3B illustrates the second portion 216 after being connected to a communication bus 122. FIG. 3C illustrates the second portion 216 locked together with a communications bus 122. According to one embodiment, the second portion 216 includes an Insulation Displacement Connector (IDC) 302 (e.g., an AVX series 9176 IDC). According to one embodiment, the IDC 302 may include a plurality of blades 304. For example, if, as discussed above, the second portion 216 (and hence the smart sensor circuit 120) is configured to be coupled to a four-wire ribbon cable, the IDC 302 will include four blades, each blade configured to be coupled to a corresponding conductor within the cable. However, according to other embodiments, the IDC 302 may include any number of blades to adequately connect the smart sensor circuit 120 to the communications bus 122.

The second portion 216 may also include a locking lid 306 coupled to the second portion 216 via a hinge 308. Prior to being coupled to the communications bus 122, the locking lid 306 of the second portion 216 is swung away from the IDC 302, allowing a user to place the communication bus 122 adjacent to the IDC 302. The user presses down on the communication bus 122, causing the communication bus 122 to press against the IDC 302. The plurality of blades 304 of the IDS 302 pierce the outer insulation layer 310 of the communication bus 122, each one of the plurality of blades 304 connecting with a corresponding conductor within the communication bus 122. The user may then swing the locking lid towards the IDC 302 and press down on the locking lid to lock the communication bus 122 into place. According to other embodiments, the second portion 216 (and hence the smart sensor circuits 120) may be coupled to the communication bus 122 in a different manner. For example, smart sensor circuits may also be coupled to the communication bus 122 via a bus bar. Upon being coupled to the communication bus 122, the smart sensor circuit 120 is in electrical communication with the CT concentrator 124.

Figure 4:
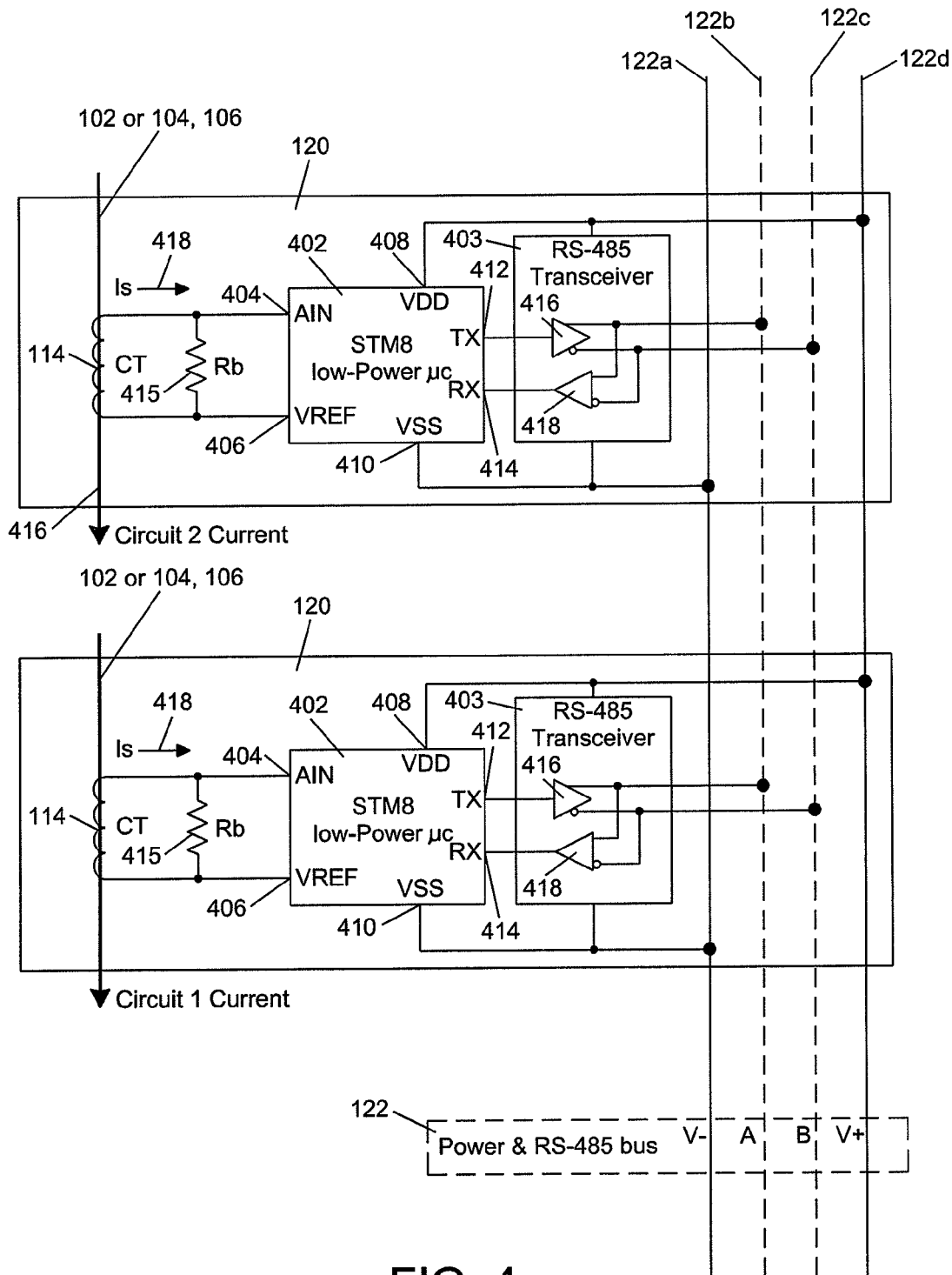
FIG. 4 is a circuit diagram of smart CT's coupled to a daisy chain bus in accordance with aspects of the present invention.

FIG. 4 is a circuit diagram of a plurality of CT's 114 and smart sensor circuits 120 coupled to a communication bus 122. Each CT 114 is coupled to a circuit branch 102, or input line 104, 106, as discussed above. For example, in one embodiment each CT 114 is configured to encompass a circuit branch 102, or input line 104, 106, as discussed in relation to FIGS. 2A and 2B. Each smart sensor circuit 120 is coupled to a communication bus 122 as discussed above. According to one embodiment, the communication bus 122 may be a 4-wire ribbon cable including a power line 122d, a D− differential pair line 122c, a D+ differential pair line 122b, and a return (ground) line 122a. In one embodiment, the communication bus 122 is a RS-485 bus; however, according to other embodiments, a different type of bus may be used.

Each smart sensor circuit 120 includes a microcontroller 402. In one embodiment, the microcontroller 402 is a low power microcontroller (e.g., an STM8 low power microcontroller). According to one embodiment, the microcontroller 402 includes an analog interface 404, a reference interface 406, a power interface 408, a return interface 410, a transmission interface 412 and a reception interface 414. According to one embodiment, the power interface 408 is coupled to the power line 122d and the return interface 410 is coupled to the return line 122a. In this way, each smart sensor circuit 120 is powered by the communication bus 122. According to another embodiment, each CT 114 is coupled in parallel between the analog interface 404 and the reference interface 406. In one embodiment, each smart sensor circuit 120 also includes a burden resistor 415 coupled in parallel between the analog interface 404 and the reference interface 406.

Each smart sensor circuit 120 also includes a transceiver 403 (e.g., an RS-485 Transceiver). According to one embodiment, the transceiver 403 includes a first diode 416 coupled between the transmission interface 412 and the communication bus 122, and a second diode 418 coupled between the reception interface 414 and the communication bus 122. Also, in one embodiment, the transceiver 403 is coupled in parallel between the power 122d and return 122a lines.

As discussed previously, AC current 416 in the circuit branch 102 or input line 104, 106 to which a CT 114 is coupled, will produce a proportionate AC current 418 in the CT 114. The burden resistor 415 converts the proportionate AC current 418 into a proportionate AC voltage. Via the analog interface 404, the microcontroller 402 receives the proportionate AC voltage and converts the proportionate AC voltage into a digital value. The microcontroller 402 then provides the digital value to the transmission line 122b via the transmission interface 412 and transceiver 403, and transmits the digital value over the communication bus 122 to the CT concentrator 124. In addition, the microcontroller 402 is configured to receive voltage, frequency and/or phase information from the CT concentrator 124, via the reception line 122c, the transceiver 403 and the reception interface 414. As discussed above, the microcontroller 402 may use the additional voltage, frequency and/or phase information received from the CT concentrator 124 along with the received proportionate AC current 418 to calculate power and energy parameters of the circuit branch 102 or input line 104, 106 such as RMS current, true and apparent power, and power factor. This information may also be converted into digital values and transmitted to the CT concentrator 124 via the transmission interface 412, the transceiver 403 and the transmission line 122b. In one embodiment, the microcontroller 402 may also use the phase information received from the CT concentrator 124 to synchronize current measurements in the smart sensor circuits 120 with voltage measurements in the CT concentrator 124

Figure 5:
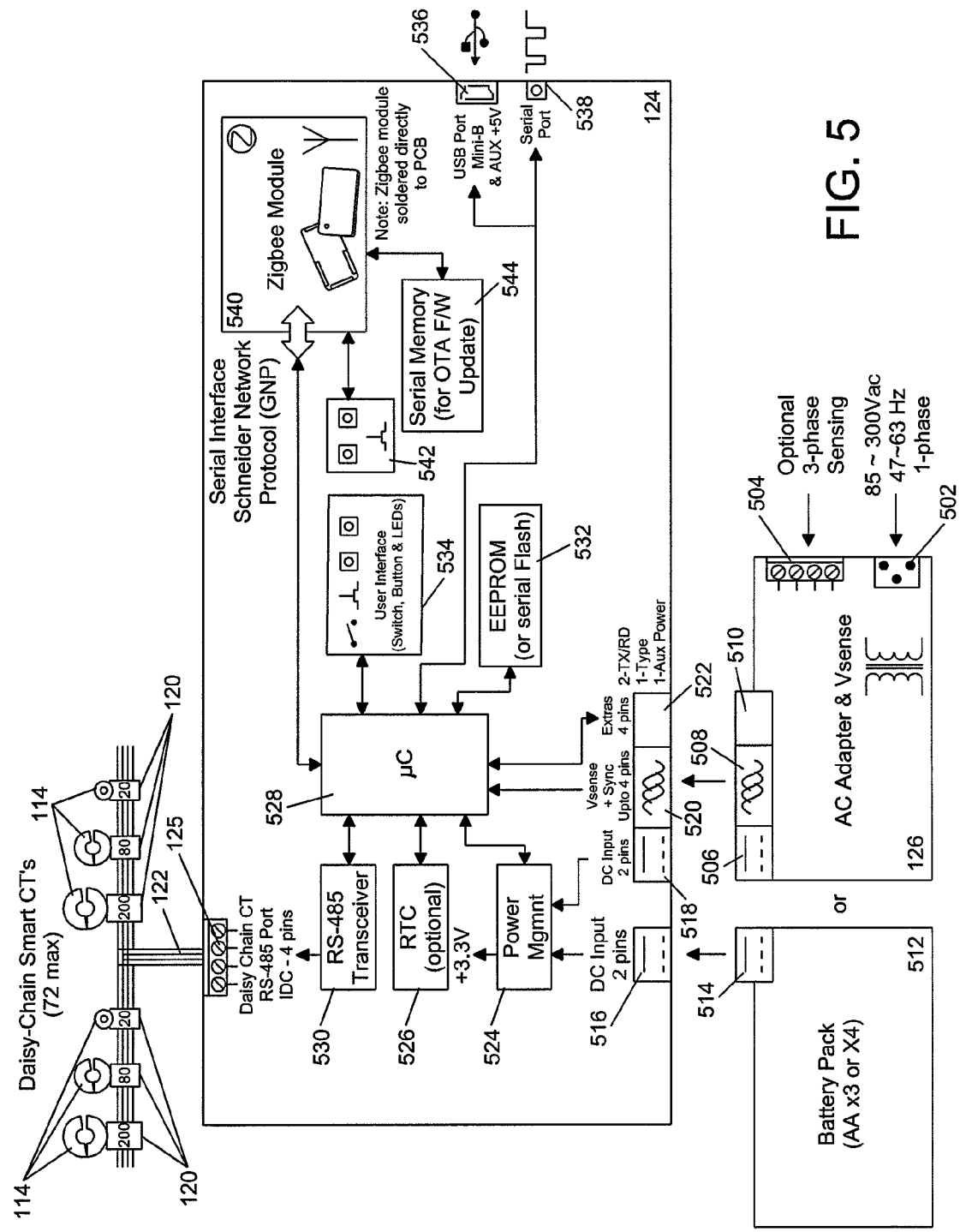
FIG. 5 is a block diagram of a concentrator in accordance with aspects of the present invention.

FIG. 5 is a block diagram of a CT concentrator 124. As discussed above, the CT concentrator 124 has a digital interface 125 coupled to the communication bus 122. The communications bus is coupled to a plurality of smart sensor circuits 120 and a plurality of CT's 114.

According to one embodiment, the CT concentrator 124 includes a power module 126. In one embodiment, the power module 126 includes a single-phase power interface 502 configured to be coupled to a single-phase power supply. In another embodiment the power module 126 includes a three-phase power interface 504 configured to be coupled to a three-phase power supply. For example, the three-phase power interface 504 may be configured to receive power from a 3-phase delta or wye power connection. It is to be appreciated that the power supply coupled to the single-phase 502 or three-phase 504 interface is the same power supply coupled to the input lines 104, 106 and as described in relation to FIG. 1. Accordingly, power received by the power module 126 is substantially the same as power being provided to the circuit branches 102.

According to one embodiment, the power module 126 also includes a DC interface 506, a sensor interface 508 and an extra pin interface 510. According to one embodiment, the extra pin interface 510 includes four additional pins (e.g., a transmission pin, a reception pin, a power module type pin and an auxiliary power pin). However, in other embodiments, the extra pin interface 510 may include any number and type of pins. According to another embodiment, the CT concentrator 124 may also include a battery pack 512 having a DC interface 514. In one embodiment, the power module 126 and/or battery pack 512 is modular and may be removed from the CT concentrator 124.

According to one embodiment, the CT concentrator 124 includes a first DC interface 516 configured to be coupled to the DC interface 514 of the battery pack 512, a second DC interface 518 configured to coupled to the DC interface 506 of the power module 126, a sensor interface 520 configured to be coupled to the sensor interface 508 of the power module 126, and an extra pin interface 522 configured to be coupled to the extra pin interface 510 of the power module 126. The extra pin interface 522 includes four additional pins (e.g., a transmission pin, a reception pin, a power module type pin and an auxiliary power pin). However, in other embodiments, the extra pin interface 522 may include any number and type of pins.

The first 516 and second 518 DC interfaces are coupled to a power management module 524. The power management module 524 is coupled to a microcontroller 528. The sensor interface 520 and the extra pin interface 522 are coupled to the microcontroller 528. The CT concentrator 124 also includes a transceiver 530 coupled between the digital interface 125 and the microcontroller 528 and a non-volatile memory module 532 coupled to the microcontroller 528. In one embodiment, the non-volatile memory module 532 includes Electrically Erasable Programmable Read-Only Memory (EEPROM); however, in other embodiments, the non-volatile memory module 532 may include any type of non-volatile memory (e.g., such as serial Flash memory).

The CT concentrator 124 also includes a user interface 534 coupled to the microcontroller. In some embodiments, the user interface may include any type of controls which allows a user to interface with the CT concentrator 124. (e.g., such controls include switches, buttons, LED's etc.). According to one embodiment, the CT concentrator 124 also includes a USB port 536 and a serial port 538.

The CT concentrator 124 also includes a wireless radio module and antenna 540. In one embodiment, the wireless radio module is a ZigBee radio; however, in other embodiments, the wireless radio module 540 may be configured using a different wireless standard. According to one embodiment, the wireless radio and antenna 540 is coupled to the microcontroller 528, an On/Off switch 542, and a serial memory module 544.

The power module 126 receives AC power from a power source (e.g., a single-phase or three phase power source) (not shown), modulates and converts the received AC power to DC power, and provides DC power to the CT concentrator 124 via the DC interface 506 and the second DC interface 518. The power management module 524 receives the DC power from the second DC interface 518 and provides appropriate DC power to components of the CT concentrator 124 (e.g., the microcontroller 528). According to another embodiment, the battery pack 512 may provide DC power to the CT concentrator 124 via the DC interface 514 and the first DC interface 516. The power management module 524 receives the DC power from the first DC interface 516 and provides appropriate DC power to components of the CT concentrator 124 (e.g., the microcontroller 528).

The power module 126 provides power signals received from the power source (e.g., single-phase or three-phase source) to the microcontroller 528 via the sensor interfaces 508, 520. In one embodiment, the power signals include a voltage sense signal and a phase synchronization signal. According to another embodiment, the power module 126 also provides additional information to the microcontroller via the extra pin interfaces 510, 522. For example, additional information may be provided to the microcontroller via a transmission pin, a reception pin, a power module type pin and an auxiliary power pin.

The microcontroller 528 receives the power signal information from the power module 126, via the sensor interface 520. The microcontroller 528 measures the voltage, frequency and phase of the power being provided to the power module 126. It is to be appreciated that as the power provided to the power module 126 is substantially the same as power provided to the circuit branches 102 (as discussed above), the voltage, frequency and phase measured by the microcontroller 528 in relation to the power module 126 is the same as the voltage, frequency and phase of the power being provided to the circuit branches 102.

Upon being powered, the microcontroller 528 begins to communicate with the smart sensor circuits 120 via the transceiver 530, the digital interface 125 and the communication bus 122. According to one embodiment, the microcontroller 528 may utilize the RS-485 physical communication protocol to communicate over the communication bus 122. However, other physical communication protocols may be used. The microcontroller 528, which acts as the primary controller, identifies which smart sensor circuits 120 are coupled to the communication bus 122. The primary microcontroller 528 treats the microcontrollers 402 as secondary controllers and assigns each secondary microcontroller 402 (and hence smart sensor circuit 120) a unique address. According to one embodiment, each time a new smart sensor circuit 120 is coupled to the communication bus 122, it is assigned a new address by the primary microcontroller 528.

According to one embodiment, the primary microcontroller 528 utilizes the Modbus serial communication protocol to define the communication and addressing on the communication bus 122. The primary microcontroller 528, using the Modbus protocol, assigns unique addresses to the smart sensor circuits 120 and sets the structure and format of the data that is transmitted over the communication bus 122. For example, according to one embodiment, communication over the communication bus 122 using the Modbus protocol may be performed as described in U.S. patent application Ser. No. 13/089,686 entitled "SYSTEM AND METHOD FOR TRANSFERRING DATA IN A MULTI-DROP NETWORK", filed on Apr. 19, 2011, which is herein incorporated by reference in its entirety. In one embodiment, the primary microcontroller 528 utilizes an auto addressing scheme. For example, the primary microcontroller 528 utilizes an auto addressing scheme as described in U.S. patent application Ser. No. 13/089,678 entitled "SYSTEM AND METHOD FOR AUTOMATICALLY ADDRESSING DEVICES IN A MULTI-DROP NETWORK", filed on Apr. 19, 2011, which is herein incorporated by reference in its entirety.

According to one embodiment, the Modbus protocol allows for up to 255 smart sensor circuits 120 to be simultaneously attached to the communication bus 122. It also is to be appreciated that the number of smart sensor circuits 120 may be limited by the load center 100 itself. For example, in common residential load centers, the maximum number of branch circuits (and hence smart sensor circuits) is seventy-two. However, according to at least one embodiment, different communication protocols may be used by the primary 528 and secondary 402 microcontrollers to allow any number of smart sensor circuits 120 to be coupled to the communication bus 122 (e.g., for use in large, commercial load centers).

According to one embodiment, once all of the smart sensor circuits 120 have been identified and assigned addresses by the primary microcontroller 528, a user, via the user interface 534, may associate each smart sensor circuit 120 with a specific load (e.g., sensor #12 is assigned to an air conditioner; sensor #13 is assigned to a Refrigerator, etc.).

Once the identification and addressing of the smart sensor circuits 120 is complete, the primary microcontroller 528 monitors the smart sensor circuits 120. The primary microcontroller 528 determines which smart sensor circuits 120 are attempting to communicate over the communication bus 122 and controls communication on the bus 122 to eliminate conflicts or data collision. In addition, according to one embodiment, the primary microcontroller 528 provides power parameter information to the smart sensor circuits 120. For example, as discussed above, the primary microcontroller 528 measures the voltage, frequency and phase of the power being provided to the power module 126 (and hence the circuit branches 102). When needed by a smart sensor circuit 120, the primary microcontroller 528 transmits the parameter information to the smart sensor circuit 120, via the transceiver 530 and communication bus 122.

As discussed above, each smart sensor circuit 120 measures the current through an associated circuit branch 102 or input line 104, 106. According to one embodiment, using the measured current and the received additional parameter (e.g., voltage, frequency and phase) information from the primary microcontroller 528, a smart sensor circuit 120 calculates power information such as RMS current, true and apparent power, and power factor of the associated circuit branch 102 or input line 104, 106. The calculated current and/or power information is transmitted to the primary microcontroller 528, via the communication bus 122, digital interface 125, and transceiver 530. In one embodiment, the power information is transmitted to the primary microcontroller 528 at a time and rate determined by the microcontroller 528. As discussed above, according to one embodiment, the primary microcontroller 528 may also receive analog current information directly from a CT 114, via an analog interface 127.

According to one embodiment, upon receiving the calculated current from the smart sensor circuits 120, the primary microcontroller 528 utilizes the measured voltage, frequency and/or phase information to calculate power and energy parameters such as RMS current, true and apparent power, and power factor of the circuit branch 102 or input line 104, 106.

The current, power and energy information is provided to the wireless radio module and antenna 540 by the primary microcontroller 528. The wireless radio module and antenna 540 wirelessly transmits the current, power and energy information to an external client (e.g., a web server, in-home display, or internet gateway) to provide electric power and energy consumption data to end users or other interested parties. According to one embodiment, the current, power and energy information may also be provided to an external client through a wired connection (e.g., via the USB port 536 or serial port 538). According to another embodiment, the current, power and energy information may be provided to an external client through another type of interface, such as en Ethernet or Power Line Communication (PLC) port (not shown).

In one embodiment described above, each smart sensor circuit 120 determines power information for its associated branch circuit and transmits the information to the CT concentrator 124. In another embodiment, which will now be described with reference to FIG. 6, the CT concentrator 124 synchronizes current measurements by each smart sensor circuit 120 with voltage measurements performed by the CT concentrator 124. This allows the CT concentrator 124 to calculate power information based only on current information received from the smart sensor circuits 120.

Figure 6:
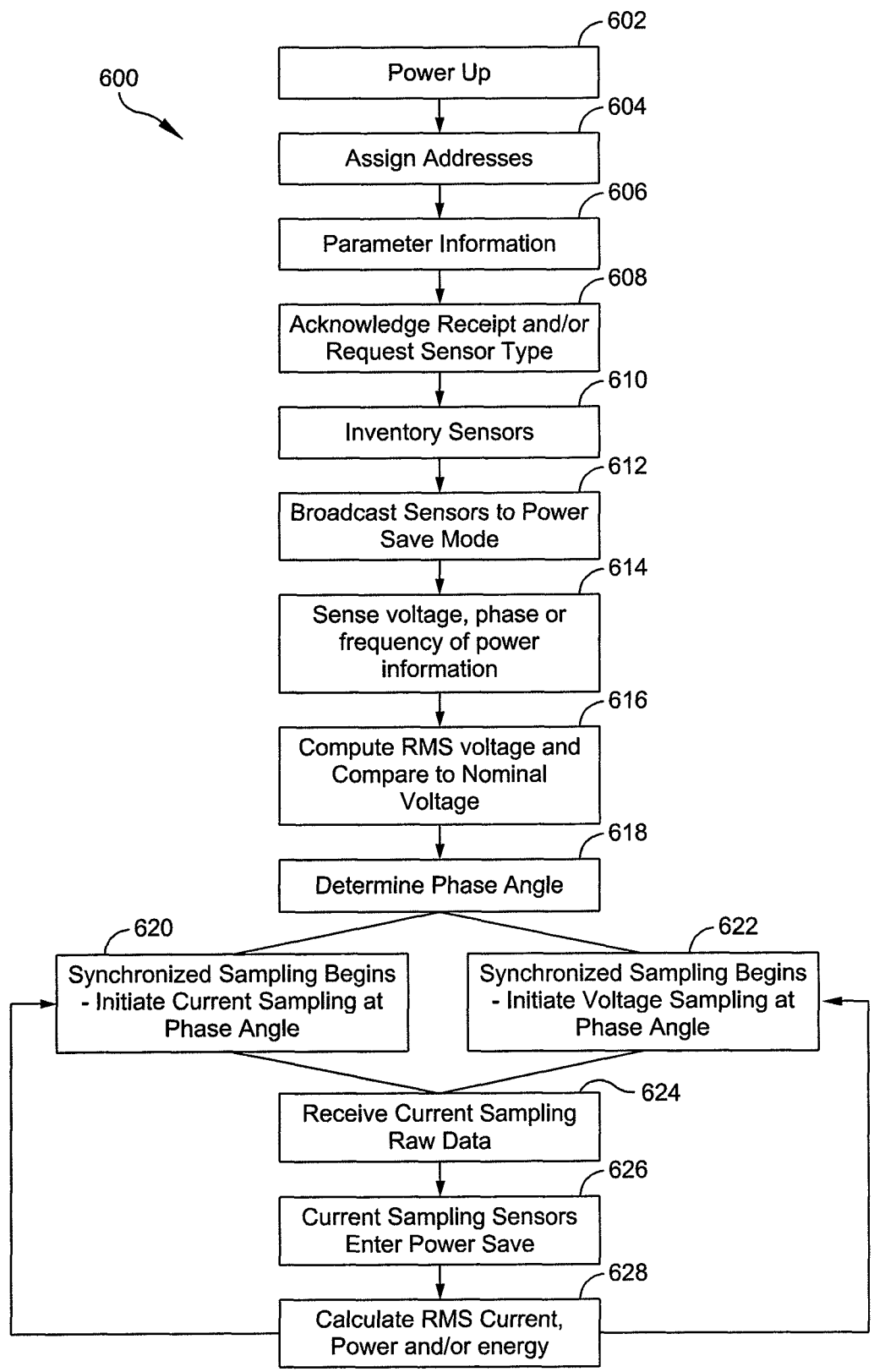
FIG. 6 is a flow chart of a method of operation of a CT concentrator in accordance with aspects of the present invention.

FIG. 6 is a flow chart of a method of operation of the CT concentrator 124 of FIG. 5, according to one embodiment. At block 602, the CT concentrator 124, and hence the smart sensor circuits 120, are powered up. At block 604, the primary microcontroller 528 of the CT concentrator assigns unique addresses to each smart sensor circuit 120, via the communications bus 122. According to one embodiment, the primary microcontroller 528 utilizes an auto addressing scheme, as discussed above. At block 606, the primary microcontroller 528 broadcasts parameter information to each smart sensor circuit 120, via the communication bus 122. According to one embodiment, the parameter information includes at least one of frequency (or period), the number of samples per period, and a defined sleep timer. In another embodiment, the broadcast information includes scaling parameters. According to another embodiment, the broadcast information includes previous cycle computation results (e.g., for RMS current, power, energy).

At block 608, the primary microcontroller 528 requests each smart sensor circuit 120 to acknowledge the receipt of the broadcast information via the communication bus 122. According to one embodiment, at block 608, the primary microcontroller 528 also requests that each smart sensor circuit 120 transmit its sensor type (e.g., 20A, 80A, or 200A current transformer) to the primary microcontroller 528 via the communication bus 122. At block 610, the primary microcontroller 528 creates an inventory of all of the sensor circuits 120 and their type (e.g., by model number). At block 612, the primary microcontroller 528 transmits to each smart sensor circuit 120 that the smart sensor circuit 120 should enter power save mode.

According to one embodiment, once a smart sensor 120 enters power save mode, a sleep timer is enabled. In one embodiment, the use of the sleep timer is intended to limit the overall power consumption of the system. For example, in one embodiment, when a smart sensor 120 is in power save mode, the smart sensor 120 will not communicate on the communication bus, and hence will require a lower level of power, until the sleep timer has expired. By placing at least a portion of the smart sensors 120 in power save mode, the total number of smart sensors 120 requiring full power is limited and the total power consumption of the system may be reduced. According to one embodiment, the sleep timer is programmable. In one embodiment, the sleep timer is configured with a time equal to slightly less than the total number of smart sensors 120 multiplied by the period over which current is to be sampled.

For example, according to on embodiment, the sleep timer is configured with a time (T) calculated with the following formula:

$$T=(s-2)*t+(t/2);$$

where:
s represents the total number of smart sensors 120, and
t represents the sample period defined by the primary microcontroller 528.

In one example, where the sample period is 20 ms and the system includes a total of 6 smart sensors 120, the time T is calculated as 90 ms. In this example, after a smart sensor 120 has conducted measurements and finished transmitting current sample raw data, it will enter power save mode for 90 ms and will not sample current again until time T (90 ms) has expired. However, in other embodiments, the sleep timer may be configured differently.

In one embodiment, smart sensors 120 currently in power save mode are configured to exit power save mode early (i.e., before the expiration of time T), to prepare for current sampling which will begin upon the expiration of time T. For example, in one embodiment, smart sensors 120 currently in power save mode are configured to exit power save mode 10 ms early. In such an embodiment, the total time each smart sensor 120 will be awake is 30 ms (20 ms period in addition to 10 ms awakening period). Hence, by staggering the current sampling performed by the smart sensors 120, the number of smart sensors 120 requiring power at the same time is limited and as a result, the total power consumption of the system is reduced. This is particularly useful for battery operated systems.

At block 614, the primary microcontroller 528 senses the voltage, frequency and/or phase of the power signal information received from the power module 126 via the sensor interface 520. For example, according to one embodiment, the primary microcontroller 528 senses voltage and/or frequency through a voltage sense signal and the primary microcontroller 528 senses phase through a phase synchronization signal. As discussed above, according to some embodiments, the power signal information received from the power module 126 may be correlated to single, double or 3-phase power.

At block 616, the primary microcontroller 528 computes the RMS voltage for all phases that are present (e.g., 1, 2, or 3). Also at block 616, the primary microcontroller 528 compares the RMS voltage to the primary microcontroller's 528 nominal voltage to confirm that the RMS voltage and phase signal(s) are correct. For example, according to one embodiment, if the primary microcontroller 528 is connected to a utility system in North America, the primary microcontroller 528 will confirm that it is measuring a 120V, 60 Hz signal. However, in another embodiment, if the primary microcontroller 528 is connected to a utility system in Europe, the primary microcontroller 528 will confirm that it is measuring a 220V, 50 Hz signal.

At block 618, the primary microcontroller 528 determines the appropriate phase angle at which synchronized measurements will be taken. According to one embodiment, the phase angle may be configured as any phase angle, and does not have to be limited to a zero crossing. In some embodiments, the phase angle may be configured at an angle other than at a zero crossing to intentionally avoid noise which may exist at the zero crossing.

At blocks 620 and 622, synchronized sampling by the primary microcontroller 529 and the smart sensor circuits 120 begins at the previously determined phase angle. For example, according to one embodiment, at block 620, the primary microcontroller 528 communicates to all of the smart sensor circuits 120 simultaneously to start sampling current in their respective circuit branches 102 at the predetermined phase angle. Also, at the same time as block 620, the primary microcontroller 528 at block 622 initiates voltage sampling of the power signal information received from the power module 126 at the previously determined phase angle to synchronize the voltage measurements with the current measurements made by all of the smart sensor circuits 120. According to one embodiment, the primary microcontroller 528 samples voltage over the same period of time in which the smart sensor circuits 120 sample current.

According to another embodiment, instead of communicating to all of the smart sensor circuits 120 simultaneously, the primary microcontroller 528 communicates to at least one specific sensor (e.g., a sensor having a unique address) to begin sampling current in the respective circuit branch 102. In this way, the primary microcontroller 528 is able to start sampling current in at least one specific type of circuit branch (e.g., a circuit branch coupled to a specific type of load). By only sampling current in a select number of circuit branches 102, the overall power consumption of the system may be reduced.

According to one embodiment, each smart sensor circuit 120 which is controlled to begin sampling will sample current in the smart sensor circuits 120 respective branch over a predefined period of time for a predefined number of samples, the time and number of samples being previously set by the primary microcontroller 528 in the broadcast parameter information. In one embodiment, the current sampling raw data is stored in a buffer of each smart sensor circuit 120.

At block 624, upon completing voltage sampling for the given period, the primary microcontroller 528 requests that each smart sensor circuit that was sampling current, transmit the current sampling raw data for the given time period from the buffer to the primary microcontroller 528 via the communication bus 122. According to one embodiment, the current sampling raw data is time-stamped.

At block 626, upon confirming receipt of the current sampling raw data, the primary microcontroller 528 broadcasts to the previous current sampling smart sensors 120 that the smart sensors 120 should enter power save mode, making more power available for other smart sensors (as discussed above).

According to one embodiment, at block 626, using the received current data and measured voltage data, the primary microcontroller 528 calculates the RMS current, power (e.g., 4 quadrant) and/or energy usage of the circuit branches 102 associated with the smart sensors 102 from which the primary microcontroller 528 received the raw current sampling data. According to one embodiment, the primary microcontroller 528 may automatically take into account any communication delay between the primary microcontroller 528 and the smart sensors 102 when making its current, power and/or energy calculations. After calculating the current, power and energy information, the primary microcontroller 528 may repeat blocks 620 to 628 for another smart sensor 120 or group of smart sensors 120.

In at least some embodiments, the use of the primary microcontroller 528 to individually control the synchronization of the smart sensor circuits 120, eliminates any need to individually wire each smart sensor circuit 120 with phase synchronization signals from the power module. Phase Locked Loop (PLL) circuitry within the smart sensor circuits 120 may also be eliminated, as the primary microcontroller 528 will control the synchronization. By allowing the primary microcontroller 528 to select the phase angle at which sampling will occur, the flexibility of the system may be increased. For example, any appropriate phase angle may be selected to provide the most desirable results.

Even though examples in accordance with the present invention are described herein in reference to a load center, other examples may be utilized within any electrical system in which current, power and energy of a power line are desired to be monitored. It also is to be appreciated that examples in accordance with the present invention may be utilized to monitor any type (e.g., commercial or residential) or size system.

Even though examples in accordance with the present invention are described herein as utilizing a current transformer 114 capable of being clamped onto a circuit branch 102, other examples may utilize a different type of current sensor. For example, current sensors utilizing shunt resistance, hall-effect, and toroidal (solid core) current transformers may be used.

In at least some examples in accordance with the present invention described herein communication between the sensor circuits 120 and the CT concentrator 124 is conducted over a wired interface (i.e. the communication bus 122). Other examples may utilize a wireless interface. For example, communication between the sensor circuits 120 and the CT concentrator 124 may be performed in compliance with a wireless standard such as the ZigBee RF4CE standard or the IEEE 802.15 standard as described in U.S. patent application Ser. No. 12/789,922 entitled "SYSTEM FOR SELF-POWERED, WIRELESS MONITORING OF ELECTRICAL CURRENT, POWER AND ENERGY", filed on May 28, 2010, which is herein incorporated by reference in its entirety.

By including only a single communication bus within a load center, rather than individual dedicated connections (e.g., "hub and spoke wiring"), and connecting all smart CT's to a CT concentrator within the load center via the single communication bus; a relatively small, less complex and more manageable method and system for utilizing a plurality of CT's to monitor circuit branches of a load center is provided.

Having thus described several aspects of at least one embodiment of this invention, it is to be appreciated various alterations, modifications, and improvements will readily occur to those skilled in the art. Such alterations, modifications, and improvements are intended to be part of this disclosure, and are intended to be within the spirit and scope of the invention. Accordingly, the foregoing description and drawings are by way of example only.

What is claimed is:

1. A current monitoring device comprising:
   a housing including a first portion and a second portion;
   a current transformer contained within the first portion of the housing and configured to be removeably coupled to a power line and to generate a reference signal having a level related to a current level of the power line; and
   a sensor circuit contained within the second portion of the housing, connected to the current transformer, and configured to be removeably coupled to a communication bus and to convert the reference signal to a digital reference signal and provide a signal indicative of the current level to the communication bus;
   wherein the second portion of the housing includes a lid capable of being opened and closed and configured to clamp the communication bus in place within the second portion of the housing when closed in a locked position; and
   wherein the second portion of the housing further includes a first opening and a second opening, and is configured to allow the communication bus to pass through the first opening and the second opening and couple to the sensor circuit within the second portion when the lid is in the locked position.

2. The current monitoring device of claim 1, wherein the first portion is rotatably coupled to the second portion.

3. The current monitoring device of claim 2, wherein the housing is configured to be rotated between a first position and a second position, wherein, in the first position, the first portion of the housing is rotated away from the second portion to allow external access to an interior chamber, and wherein, in the second position, the first portion of the housing is rotated towards the second portion so that the housing encompasses the interior chamber.

4. The current monitoring device of claim 2, wherein the second portion of the housing includes an insulation displacement connector configured to couple the sensor circuit to the communication bus.

5. The current monitoring device of claim 1, wherein the sensor circuit is configured to receive power from the communication bus.

6. The current monitoring device of claim 5, wherein the sensor circuit further includes a transceiver coupled to a microcontroller and configured to receive the digital reference signal and provide data related to the digital reference signal to the communication bus.

7. The current monitoring device of claim 6, wherein the transceiver is further configured to receive data from the communication bus indicative of at least one of voltage, frequency and phase information of the power line.

8. The current monitoring device of claim 7, wherein the microcontroller is configured to calculate power parameters of the power line using the digital reference signal and the data from the communication bus.

9. A method for monitoring a power line within a load center using a current monitoring device having a housing with a first portion and a second portion, the method comprising:

coupling a current transformer to the power line within the load center, the current transformer being disposed within the first portion of the housing;

opening a lid of the second portion of the housing;

passing a communication bus within the load center through the second portion of the housing;

clamping the lid of the second portion of the housing onto the communication bus to lock the communication bus in place within the second portion of the housing;

coupling a sensor circuit within the second portion of the housing to the communication bus;

generating, with the current transformer, a reference signal having a level related to a current level of the power line;

converting, with the sensor circuit, the reference signal to a digital reference signal; and providing the digital reference signal to the communication bus.

10. The method of claim 9, wherein the act of coupling the current transformer to the power line includes encompassing the power line within the current transformer.

11. The method of claim 9, wherein the act of coupling the sensor circuit to the communication bus includes piercing an outer insulation layer of the communication bus with at least one contact of the sensor circuit and connecting the at least one contact to an appropriate conductor within the communication bus.

12. The method of claim 9, further comprising assigning a unique address to the sensor circuit over the communication bus.

13. The method of claim 12, wherein the act of providing includes providing the digital reference signals to the communication bus at a time designated by an external controller.

14. The method of claim 9, further comprising receiving, with the sensor circuit, power from the communication bus.

* * * * *